(12) United States Patent
Kobayashi

(10) Patent No.: US 6,861,909 B1
(45) Date of Patent: Mar. 1, 2005

(54) HIGH VOLTAGE-WIDE BAND AMPLIFIER

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 7 days.

(21) Appl. No.: 10/173,296

(22) Filed: Jun. 17, 2002

(51) Int. Cl.[7] .............................................. H03F 3/04
(52) U.S. Cl. ........................................ 330/311; 330/250
(58) Field of Search ................................. 330/311, 250, 330/296, 98, 99, 100, 310

(56) References Cited

U.S. PATENT DOCUMENTS

| | | | | |
|---|---|---|---|---|
| 4,259,939 A | * | 4/1981 | Coates | 123/605 |
| 4,312,011 A | | 1/1982 | Kanbayashi | 357/46 |
| 4,586,004 A | * | 4/1986 | Valdez | 330/300 |
| 4,616,144 A | | 10/1986 | Hideshima et al. | 307/315 |
| 4,706,038 A | | 11/1987 | Navidi et al. | 330/271 |
| 4,755,694 A | | 7/1988 | Bodig et al. | 307/315 |
| 4,777,386 A | | 10/1988 | Majumdar | 307/270 |
| 4,855,625 A | * | 8/1989 | Webb | 327/561 |
| 4,922,129 A | * | 5/1990 | Wright | 327/575 |
| 5,397,914 A | | 3/1995 | Suda et al. | 257/570 |
| 5,661,431 A | | 8/1997 | Ueno et al. | 327/483 |
| 5,708,393 A | * | 1/1998 | Huynh Luong et al. | 330/265 |

* cited by examiner

*Primary Examiner*—Patricia Nguyen
(74) *Attorney, Agent, or Firm*—Christopher P. Maiorana, PC

(57) ABSTRACT

An apparatus comprising a Darlington transistor pair, a first common-base transistor and a second common-base transistor. The Darlington transistor pair may be configured to generate an output signal in response to an input signal. The first common-base transistor may be coupled between the Darlington transistor pair and the output signal. The second common-base transistor may also be coupled between the Darlington transistor pair and the output signal. The first and second common-base transistors may each have a base configured to receive a reference voltage.

23 Claims, 13 Drawing Sheets

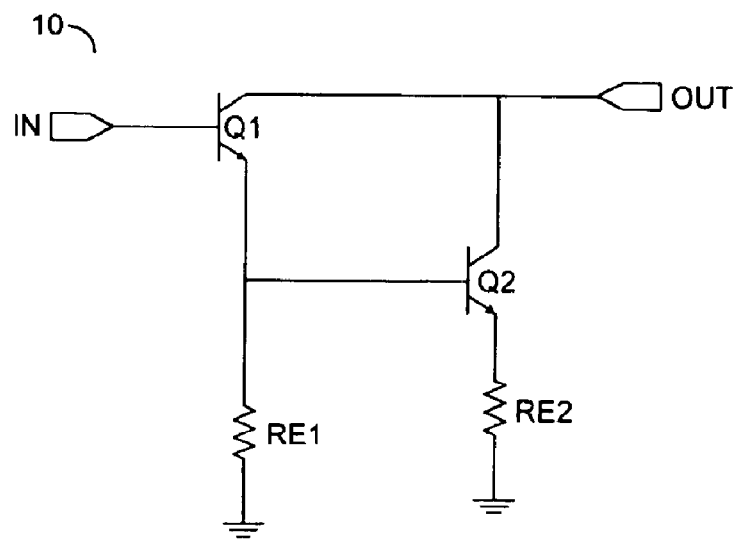
(CONVENTIONAL)
FIG. 1
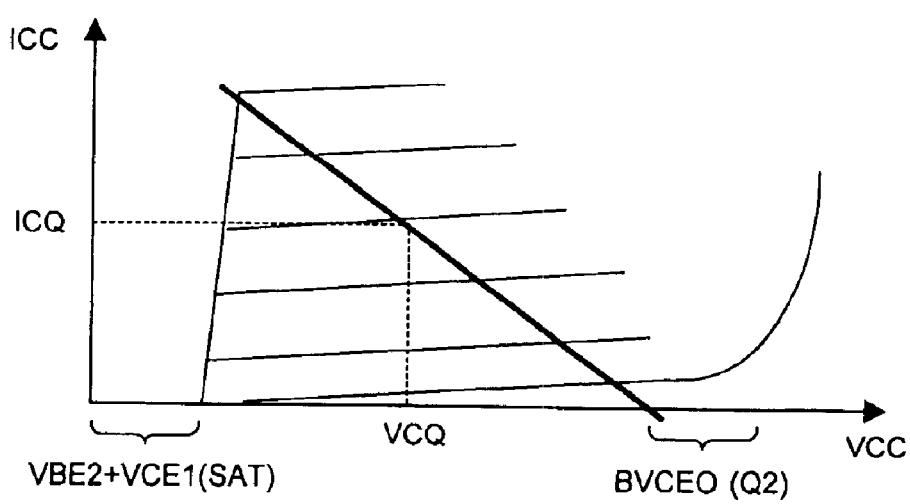
(CONVENTIONAL)
FIG. 2

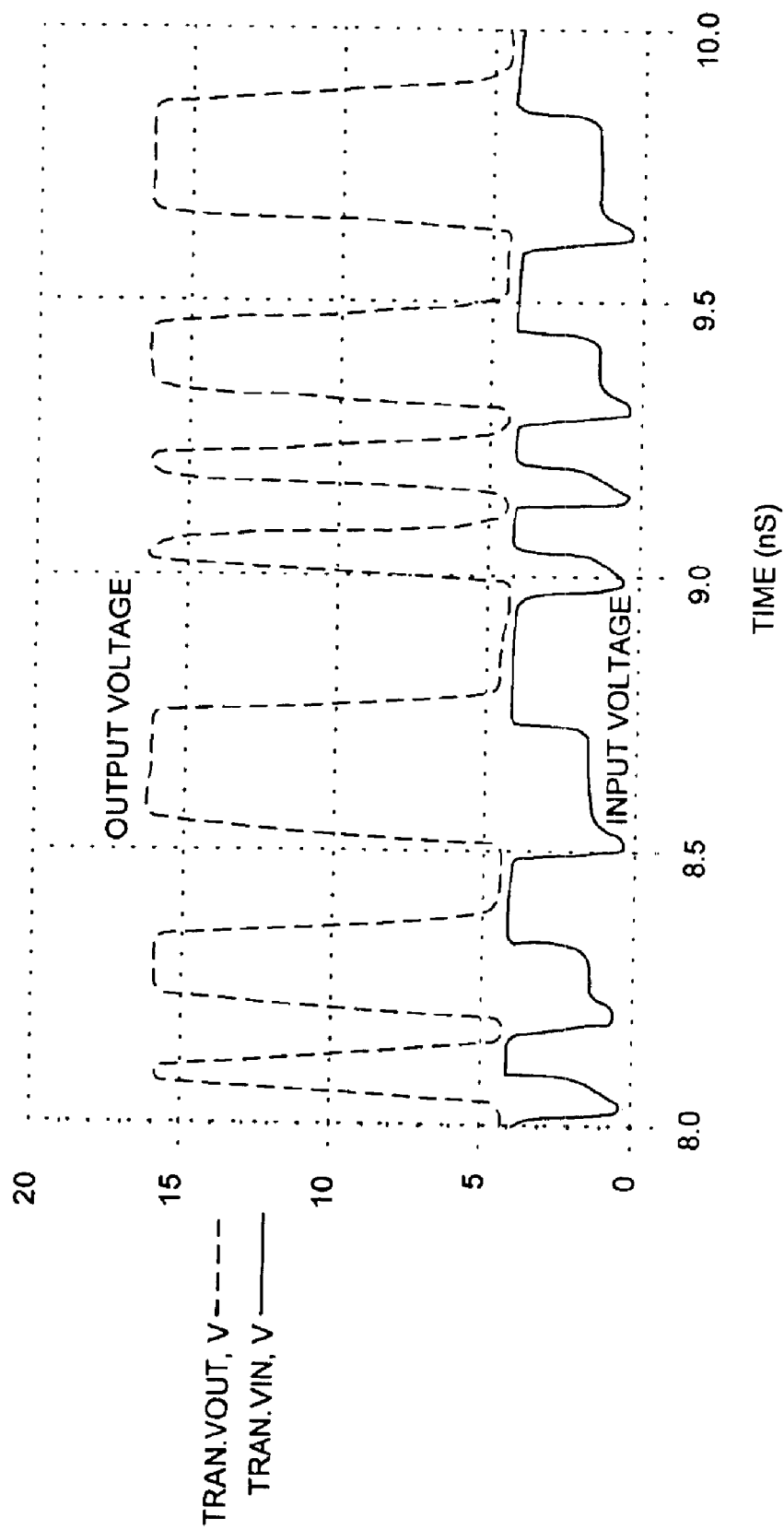

US 6,861,909 B1

HIGH VOLTAGE-WIDE BAND AMPLIFIER

FIELD OF THE INVENTION

The present invention relates to amplifiers generally and, more particularly, to a method and/or architecture for implementing a high voltage-wide band amplifier.

BACKGROUND OF THE INVENTION

Multi-decade high voltage driver amplifiers are needed for both cable-television (i.e., 10 MHz–1.2 Ghz) and SONET 12.5 Gb/s OC-192 optical modulator transmitter applications. Wide bandwidth and high output voltage operation is achieved by combining broad band circuit topologies such as distributed and Darlington feedback amplifiers with a high speed technology such as SiGe or InP heterojunction bipolar transistors (HBTs). However, high speed technologies are typically characterized by low device breakdown voltages.

In order to satisfy the need for wide bandwidth and high voltage output, conventional approaches often implement a Darlington amplifier pair. A Darlington pair can increase the bandwidth of a traditional common-emitter feedback amplifier by replacing the common-emitter transistor with a Darlington pair. FIG. 1 illustrates a circuit 10 implementing such a conventional Darlington amplifier which includes transistors Q1 and Q2. Bandwidth improvements as much as a factor of two can be obtained. To further increase bandwidth response, high speed semiconductor technologies such as SiGe or InP heterojunction bipolar transistors (HBTs) can be implemented in the Darlington design. However these higher speed device technologies usually have a low breakdown voltage (BVceo), which can limit the maximum voltage swing and delivered output power. FIG. 2 illustrates the maximum output a swing capability of the circuit 10 of FIG. 1.

The conventional Darlington amplifier is noted for having a high gain and wide bandwidth. However, the maximum output voltage swing of the conventional Darlington pair is limited by the difference between the breakdown voltage BVceo and the saturation knee voltage of the Darlington pair defined as Vbe2+Vce1(sat) as shown in FIG. 2. On the negative output voltage swing of the Darlington pair, the transistor Q1 begins to saturate at (Vbe+Vce(sat)), limiting the negative voltage excursion. On the positive output voltage swing, the output voltage does not swing beyond the breakdown voltage BVceo of the transistor Q2 without damaging the device, which limits the positive voltage excursion. For high speed SiGe or InP HBT processes, the breakdown voltage BVceo tends to be low which can limit implementation in broadband laser modulator driver applications, for example.

Referring to FIG. 3, a current versus voltage characteristic curve of the circuit 10 is shown. The current-voltage offset voltage of the circuit 10 is one base to emitter voltage (Vbe) level higher than the common-emitter saturation voltage. The output voltage swing does not exceed the breakdown voltage BVceo of the device technology.

Referring to FIG. 4, a small signal response of the circuit 10 is illustrated. The gain and 3-dB bandwidth of the conventional Darlington amplifier implementation of the circuit 10 are 15.5 dB and 8 GHz, respectively, as illustrated by the curve S21.

It would be desirable to implement an amplifier or device with an enhanced breakdown voltage while still providing wide gain bandwidth capability without incurring the cost of state of the art technologies such as GaN transistors.

SUMMARY OF THE INVENTION

The present invention concerns an apparatus comprising a Darlington transistor pair, a first common-base transistor and a second common-base transistor. The Darlington transistor pair may be configured to generate an output signal in response to an input signal. The first common-base transistor may be coupled between the Darlington transistor pair and the output signal. The second common-base transistor may also be coupled between the Darlington transistor pair and the output signal. The first and second common-base transistors may each have a base configured to receive a reference voltage.

The objects, features and advantages of the present invention include providing a wide band high voltage Darlington topology that may (i) integrate common-base transistors within a Darlington pair to achieve improved breakdown voltage, thermal stability, and/or bandwidth compared with conventional approaches, (ii) implement a low impedance voltage reference to the common-base transistor(s) to improve breakdown voltage of the transistor(s), (iii) implement a cascoded Darlington pair having a wideband feedback amplifier configured to drive high voltage optical modulator devices, and/or (iv) integrate a cascode Darlington pair with an existing Darlington pair for improving breakdown voltage, thermal stability, and/or bandwidth compared with conventional approaches.

BRIEF DESCRIPTION OF THE DRAWINGS

These and other objects, features and advantages of the present invention will be apparent from the following detailed description and the appended claims and drawings in which:

FIG. 1 is a diagram of a conventional Darlington pair;

FIG. 2 is a diagram of the maximum output swing capability of the circuit of FIG. 1;

FIG. 17 illustrates a pseudo-random transient response of the circuit of FIG. 11.

DETAILED DESCRIPTION OF THE PREFERRED EMBODIMENTS

The present invention may integrate common-base transistors within a Darlington pair to improve the overall breakdown voltage, thermal behavior, and/or bandwidth of such a Darlington topology. The present invention may use a low impedance voltage reference to provide the base bias of the common-base transistors. Such a base bias may increase the Darlington breakdown voltage to a value approaching a breakdown voltage (e.g., Bvcbo) of the common-base transistors.

Figure 5:
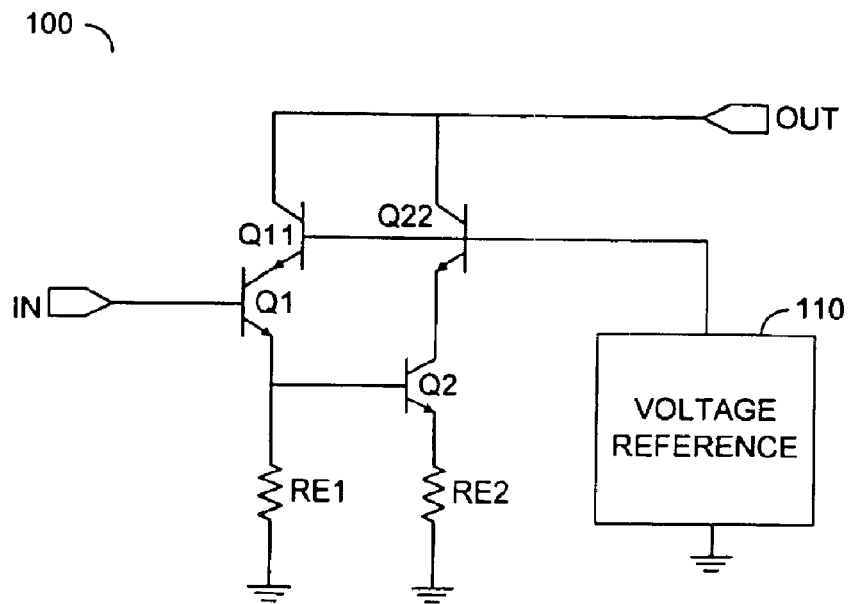
FIG. 5 is a diagram of a preferred embodiment of the present invention.

Referring to FIG. 5, a diagram illustrating a circuit 100 implementing a cascode Darlington amplifier in accordance with a preferred embodiment of the present invention is shown. The circuit 100 generally integrates (or couples) common-base transistors (e.g., transistors Q11 and Q22) with a Darlington transistor pair (e.g., transistors Q1 and Q2) to improve overall breakdown voltage, thermal stability and/or bandwidth of the circuit 100 when compared to conventional approaches. Specifically, the transistors Q11 and Q22 share the same base and collector nodes and are integrated within the collector output of the Darlington pair (e.g., respective collector circuits of the transistors Q1 and Q2). The common base transistors Q11 and Q22 may break the positive thermal-electric feedback loop from the output (e.g., OUT) to the bases of the transistors Q1 and Q2 thereby increasing the effective breakdown voltage BVceo of the transistors Q1 and Q2. The circuit 100 may be configured to generate the output signal OUT in response to the input signal (e.g., IN).

A low impedance reference voltage circuit 110 may be connected to the respective bases of the common-base transistors Q11 and Q22. The circuit 110 may be configured to provide a base bias signal (or voltage) to the transistors Q11 and Q22. In one example, the circuit 110 may be implemented as a band-gap reference and voltage generation circuit. However, the voltage reference circuit 110 may be implemented as any appropriate low impedance voltage reference generator to meet the design criteria of a particular application. The circuit 110 may reduce thermal-electric feedback of the transistors Q11 and Q22 and may increase the cascode Darlington breakdown voltage to as high as the value BVcbo+Vbe1+Vbe2 corresponding to the transistors Q1 and Q2, respectively. Generally, the lower the impedance of the voltage reference 110, the higher the effective breakdown voltage of the circuit 100.

Figure 6:
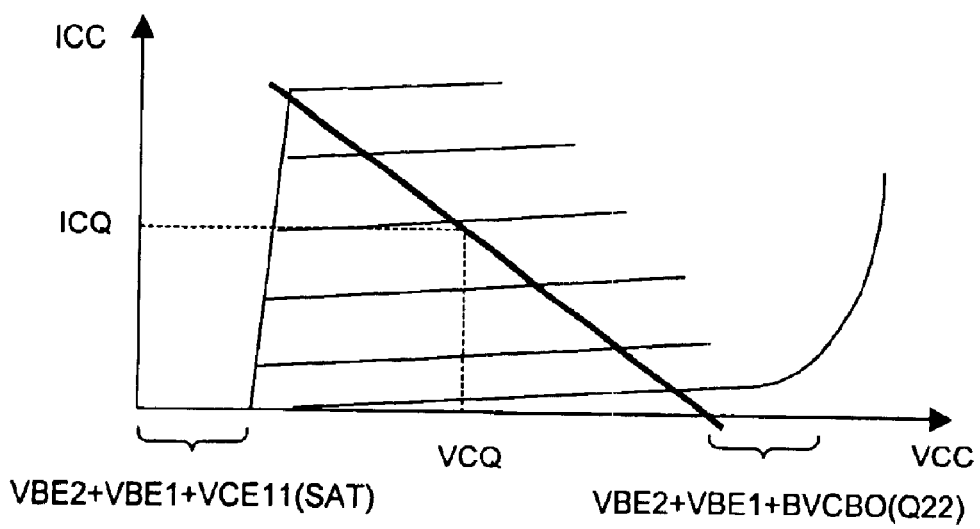
FIG. 6 is a diagram of the maximum output swing capability of the circuit of FIG. 5.

Referring to FIG. 6, a diagram illustrating the output swing of the circuit 100 is shown. As the reference voltage impedance presented to the bases of the transistors Q11 and Q22 approaches zero, the breakdown voltage of the cascode Darlington 100 approaches Vbe2+Vbe1+BVcbo. The voltage knee of the cascode Darlington circuit 100 generally increases by another Vbe due to the addition of the common-base stages Q11 and Q22. The new value of the knee voltage is generally defined as Vbe2+Vbe1+Vcell(sat). The value of the knee voltage for practical operation is generally determined when a collector to emitter voltage Vce1 is maintained to at least one Vbe. The difference between the breakdown voltage and knee voltage generally defines the maximum output swing capability of the device (e.g., the circuit 100) configuration. In the best case, the overall output voltage swing capability may increase from BVceo to approximately the breakdown voltage BVcbo of the device. The transistors Q11 and Q22 may improve the output voltage OUT swing and dynamic range (e.g., the output voltage swing and the dynamic range of the circuit 100).

The knee voltage is generally calculated with the low impedance voltage reference 110 connected to the bases of the transistors Q11 and Q22 and presenting the base bias signal to the transistors Q11 and Q22.

Figure 7:
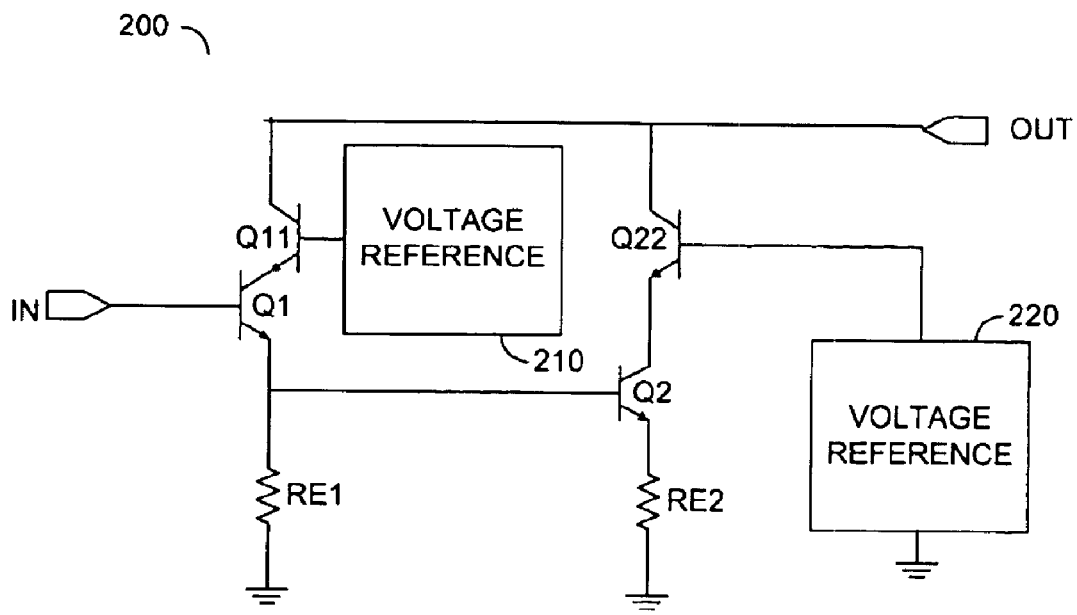
FIG. 7 is a diagram of an alternate embodiment of the present invention.

Referring to FIG. 7, a diagram illustrating a circuit 200 implementing a cascode Darlington configuration in accordance with an alternate embodiment of the present invention is shown. The cascode Darlington circuit 200 embodiment may be implemented similarly to the circuit 100. The voltage reference presented to the bases of the transistors Q11 and Q22 may be separated (or split) into a first voltage reference 210 and a second voltage reference 220, respectively. The underlying principle of operation of the circuit 200 may be similar to the operation of the circuit 100. The circuits 210 and 220 may each be implemented similarly to the circuit 110. In one example, the circuits 210 and 220 may be implemented to present substantially the same impedances (e.g., a low impedance) and/or bias signals to the transistors Q11 and Q22. In another example, the circuits 210 and 220 may be configured to present a low impedance and different bias signals to the respective transistors Q11 and Q22. However, each of the voltage reference circuits 210 and 220 may be implemented presenting any appropriate impedance and/or bias signal to meet the design criteria of a particular application.

By splitting the transistor Q11 and Q22 base voltage reference into two different voltage references (e.g., the circuits 210 and 220), greater DC and RF isolation between the common-base transistors Q11 and Q22 may be achieved. The improved DC and RF isolation of the present invention may generate less intermodulation distortion when the topology 200 is implemented in an RF application as compared to conventional approaches.

Furthermore, the two independent voltage references 210 and 220 may provide electronic bias optimization. For example, bias tuning the respective bases of the transistors Q11 and Q22 via adjustment of the circuit 210 and 220 impedances and/or bias signals may provide improved intermodulation distortion response due to the optimization of cancellation mechanisms within the topology of the circuit 200 when compared to conventional approaches. In addition, the implementation of different RF load impedances on the bases of the transistors Q11 and Q22 (e.g., implementing the circuits 210 and 220 having different impedances) may also provide uniquely optimized intermodulation distortion.

Figure 8:
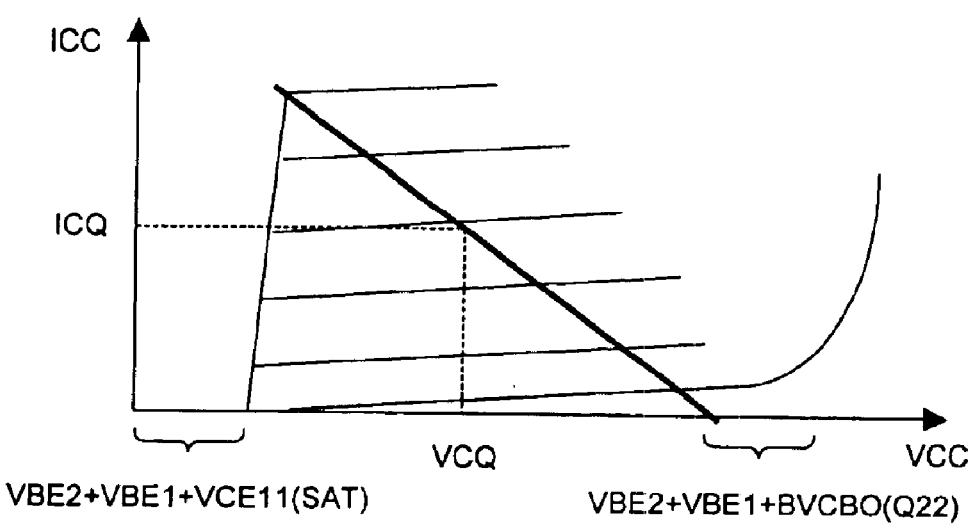
FIG. 8 is a diagram of the maximum output swing capability of the circuit of FIG. 7.

Referring to FIG. 8, a diagram illustrating the maximum output swing capability of the circuit 200 of FIG. 7 is shown. The circuit 200 may have a swing capability similar to the circuit 100.

Figure 9:
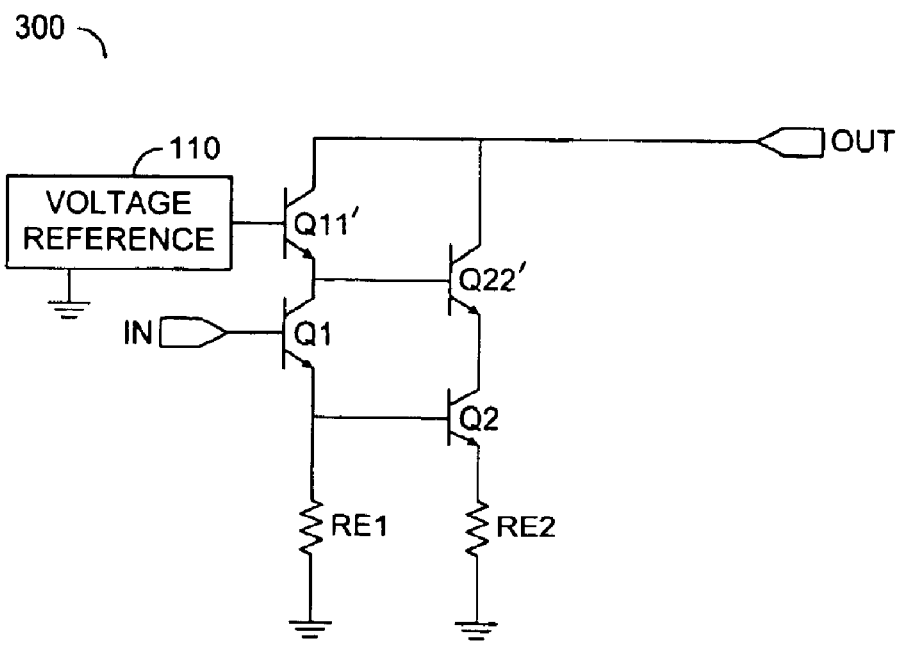
FIG. 9 is a diagram of another alternate embodiment of the present invention.

Referring to FIG. 9, a diagram illustrating a circuit 300 implementing a cascode Darlington topology in accordance with another alternate embodiment of the present invention is shown. The circuit 300 may be implemented similarly to the circuit 100. The cascode Darlington circuit 300 generally integrates transistors Q11' and Q22' in a Darlington topology. The transistors Q11' and Q22' may be implemented similarly to a Darlington pair configuration. Similarly to the circuit 100, the transistors Q11' and Q22' improve overall breakdown voltage, thermal stability and/or bandwidth when compared to conventional approaches. As implemented in the circuit 300, the transistors Q11' and Q22' may share the same collector node. However, the transistors Q11' and Q22' of the circuit 300 generally do not share the same base nodes. Specifically, the transistors Q11' and Q22' are connected as a Darlington pair and the emitter of the transistor Q11' is coupled to the base of transistor Q22'. Such a Darlington pair configuration may further reduce the impedance presented to the base of the transistor Q22' such that a higher output breakdown voltage of the circuit 300 may be attainable when compared to conventional approaches.

Similarly to the circuit 100, the transistors Q11' and Q22' may be implemented as common base transistors that are configured to break the positive thermal-electric feedback from the output (e.g., OUT) to the bases of the transistor Q1 and Q2 thereby increasing the effective breakdown voltage. The low impedance reference voltage circuit 110 may be connected to the base of the transistor Q11' and present an impedance and a bias signal to the base of the transistor Q11'. The reference circuit 110 generally reduces thermal-electric feedback of the transistor Q11'. The circuit 300 may achieve a potential device breakdown voltage of Vbe2+BVcbo. Since the emitter of the transistor Q11' is generally coupled to the base of the transistor Q22', the impedance presented to the base of the transistor Q22' may be reduced by the Beta of the transistor Q11'. Such a configuration generally improves the breakdown voltage of the transistor Q22' to a greater level than the breakdown voltage improvements of the transistor Q11'. The resulting breakdown voltage of the overall configuration (e.g., the circuit 300) may be as high as BVcbo+Vbe2. The knee voltage may be approximately 2 Vbe. Thus, the total potential output voltage swing capability of the circuit 300 is generally (BVcbo-Vbe), which may be one Vbe less than potentially achievable from the circuit 200.

However, the circuit 300 may be more effective in practical applications, since a lower impedance on the base of the transistor Q22' may ensure high voltage operation on the large output device Q22' under dynamic loading conditions. Such loading conditions may occur when the load line of the device or circuit where the circuit 300 is implemented is elliptical and crossing over combinations of current-voltage may not be taken into account in the simple analysis. The circuit 300 may provide a breakdown voltage that may be approximately BVceo without the implementation a of cumbersomely large monolithic bypass capacitors of conventional approaches.

Figure 10:
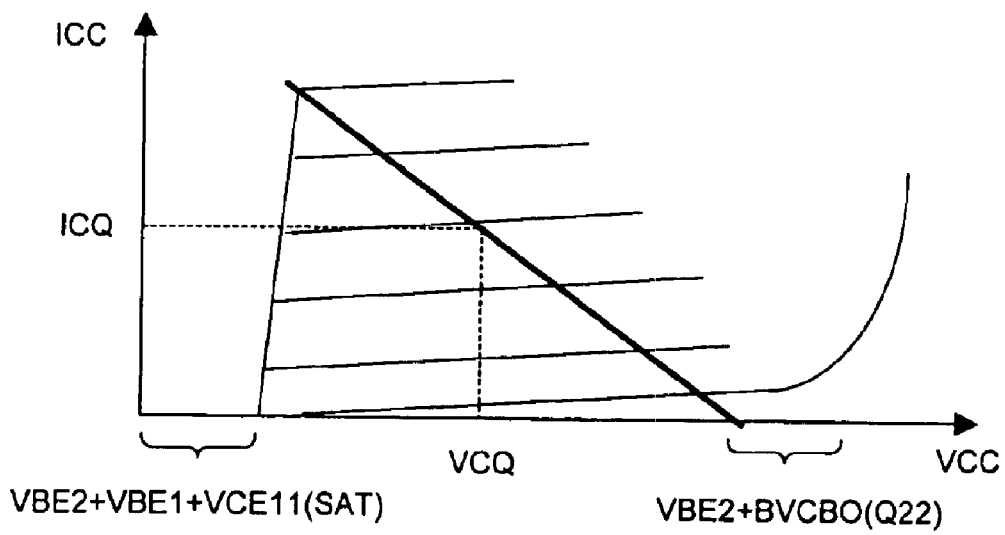
FIG. 10 is a diagram of the maximum output swing capability of the circuit of FIG. 9.

Referring to FIG. 10, a diagram illustrating the maximum output swing capability of the circuit 300 of FIG. 9 is shown. The total potential output swing capability may be (BVcbo-Vbe).

In one example, the cascode Darlington circuit 100 of FIG. 5 may be implemented in a wideband feedback amplifier topology configured to drive an external optical Mach Zehnder Modulator for 12.5 Gb/s SONET OC-192 applications. The circuit 100 may be implemented using commercially available InP DHBT technology with fT=175 GHz and Fmax=200 Ghz. However, the circuit 100 (as well as the circuits 200 and/or 300) may be implemented as other semiconductor technologies such as SiGe HBT, GaAs HBT, pseudomorphic high electron mobility transistor (PHEMT), CMOS, etc. to meet the design criteria of a particular application.

Figure 11:
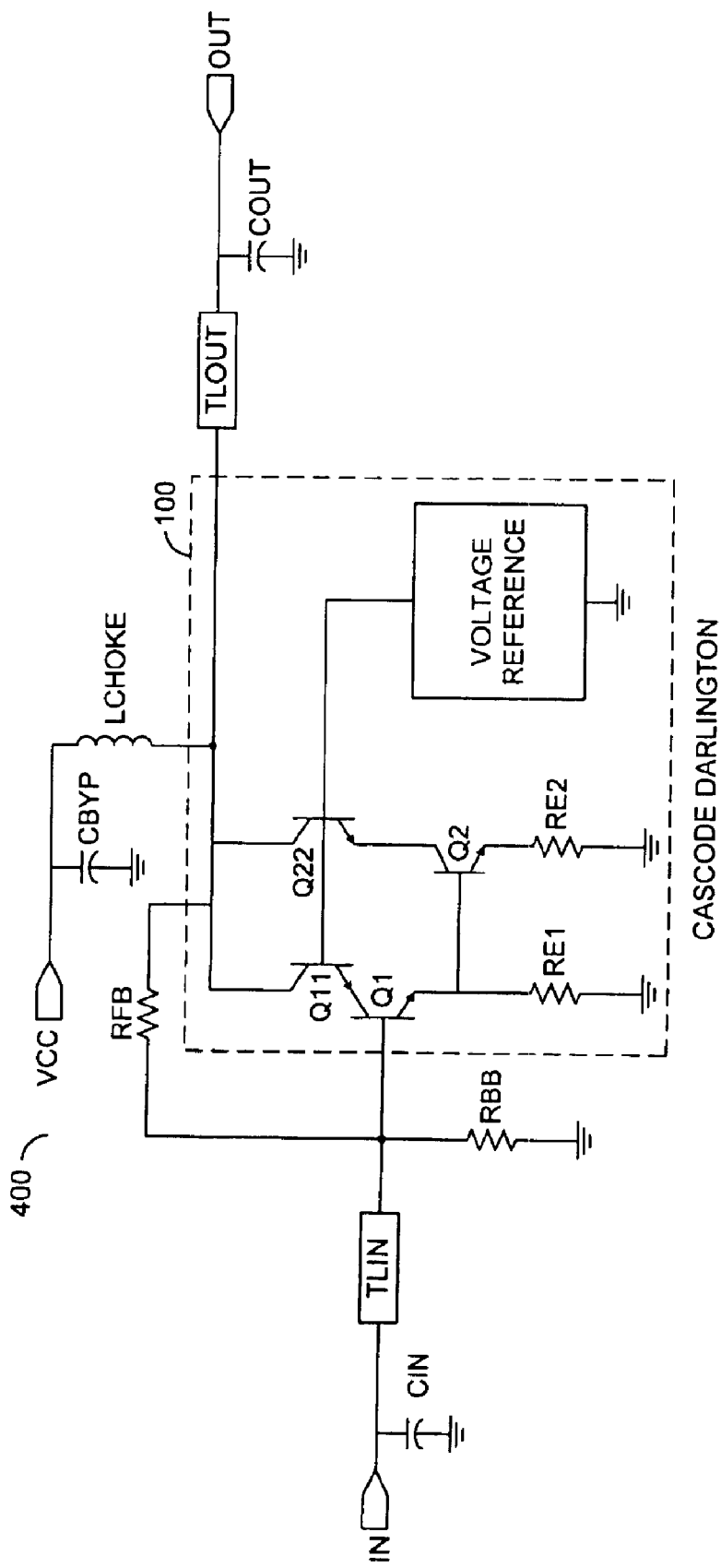
FIG. 11 is a diagram of a wide band driver amplifier application of the present invention.

Referring to FIG. 11, a diagram 400 illustrating an example of the circuit 100 implemented in an InP HBT driver IC topology is shown. The topology 400 generally comprises the cascode Darlington circuit 100 with parallel feedback (e.g., a feedback resistor RFB coupled to collectors of the transistors Q11 and Q22). A target small signal gain and bandwidth for the circuit 400 may be 15 dB and 15 GHz, respectively. An output voltage of greater than 6V peak to peak may be implemented via the circuit 400 to achieve a useable extinction ratio (e.g., a logic HIGH or 1 level to logic LOW or 0 level ratio).

Figure 3:
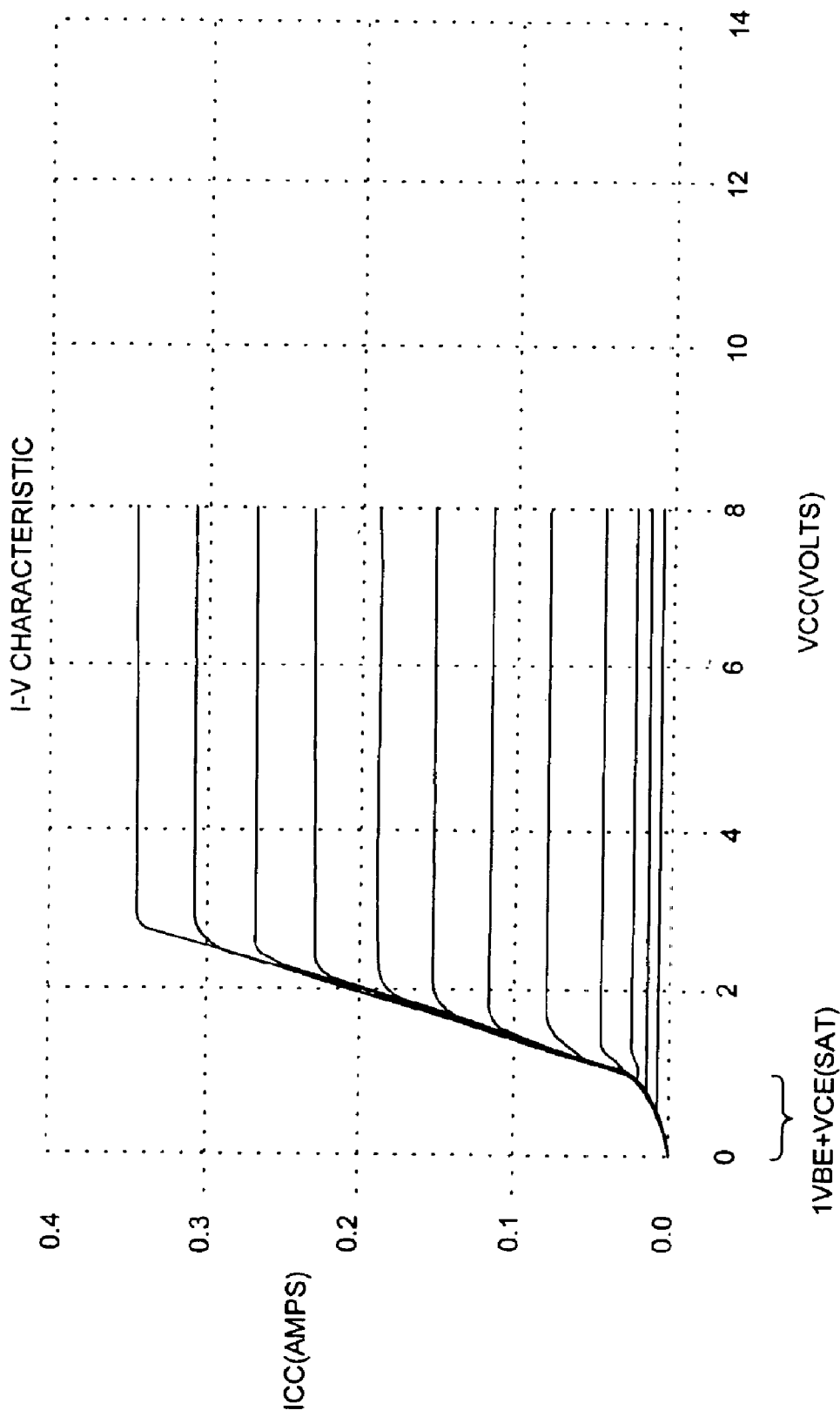
FIG. 3 is a diagram of a current-voltage curve of the conventional Darlington pair of FIG. 1.
Figure 4:
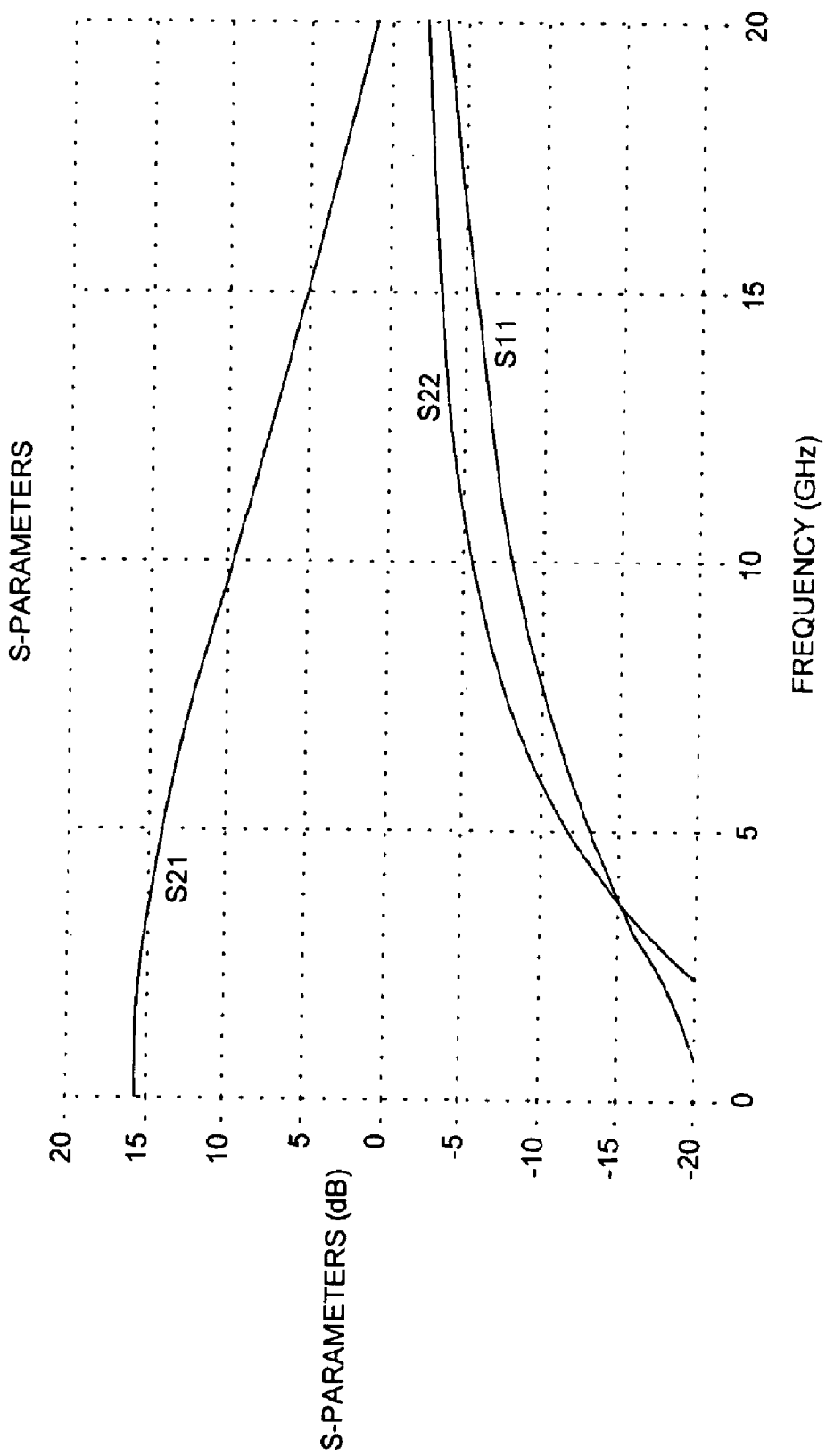
FIG. 4 illustrates the small signal response of a conventional Darlington pair of FIG. 1.

Referring to FIGS. 12–17, simulations of the circuit 100 as implemented in the topology 400 based on a commercially available InP HBT technology with fT=150 GHz and fmax>200 Ghz are shown. The simulation may approximate a 10 Gb/s external laser modulator driver configured for synchronous optical network (SONET) OC-192 applications that may be implemented having greater than 12 GHz bandwidth and output voltage swings in excess of 6V peak to peak. The results of the simulations illustrated in FIGS. 12–13 may be contrasted with the results of the conventional device 10 as illustrated in FIGS. 3–4, respectively.

Figure 12:
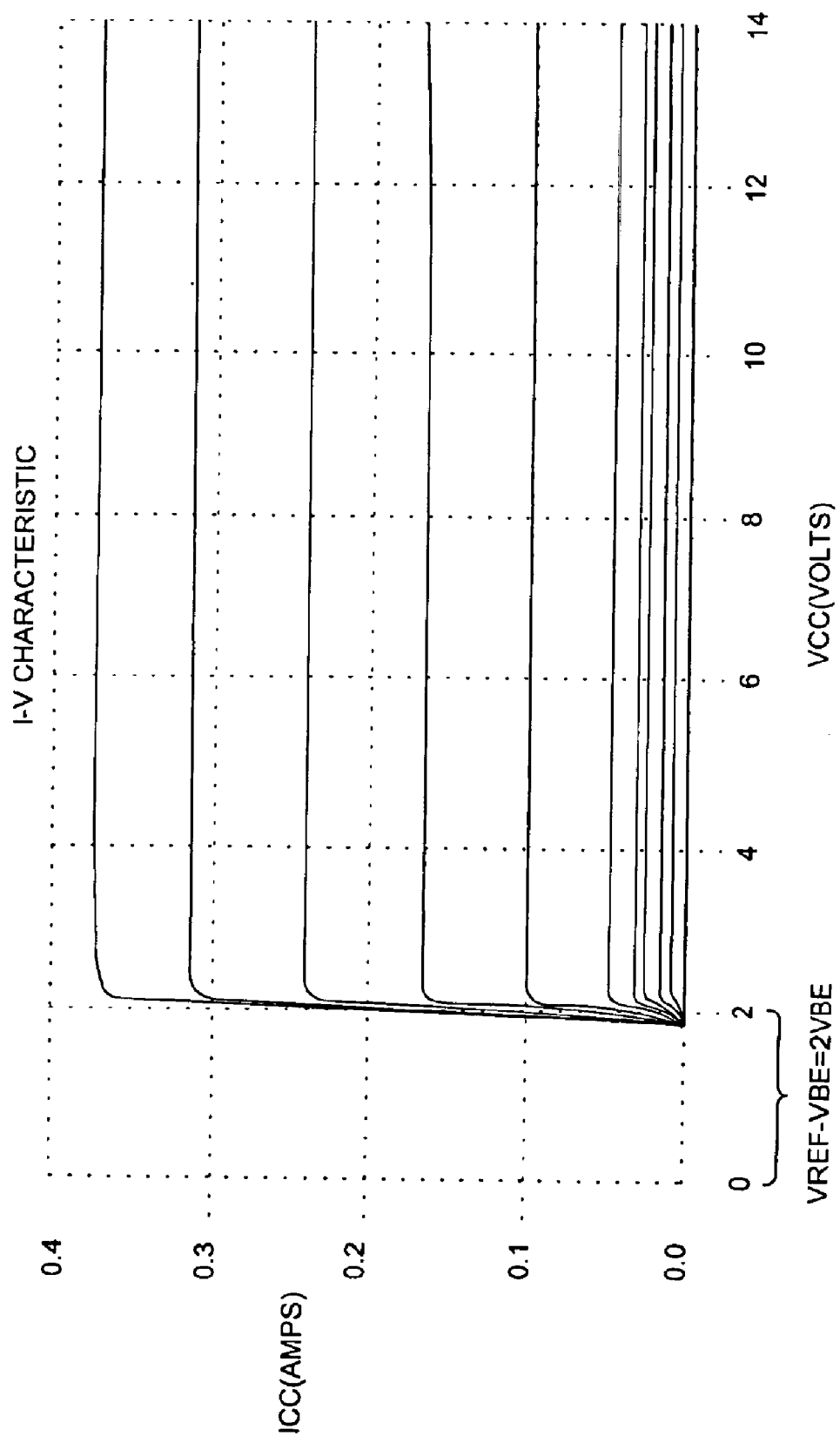
FIG. 12 is a diagram of a voltage-current curve of the circuit of FIG. 5.

Referring to FIG. 12, a diagram illustrating a current versus voltage (I-v) curve of the circuit 100 is shown. The I-V offset voltage may be as low as 2*Vbe (e.g., Vref–Vbe). An offset voltage lower than 2*Vbe may compromise the RF bandwidth and power characteristics of the circuit 100. The output voltage swing may approach the breakdown voltage BVcbo of the device technology.

Figure 13:
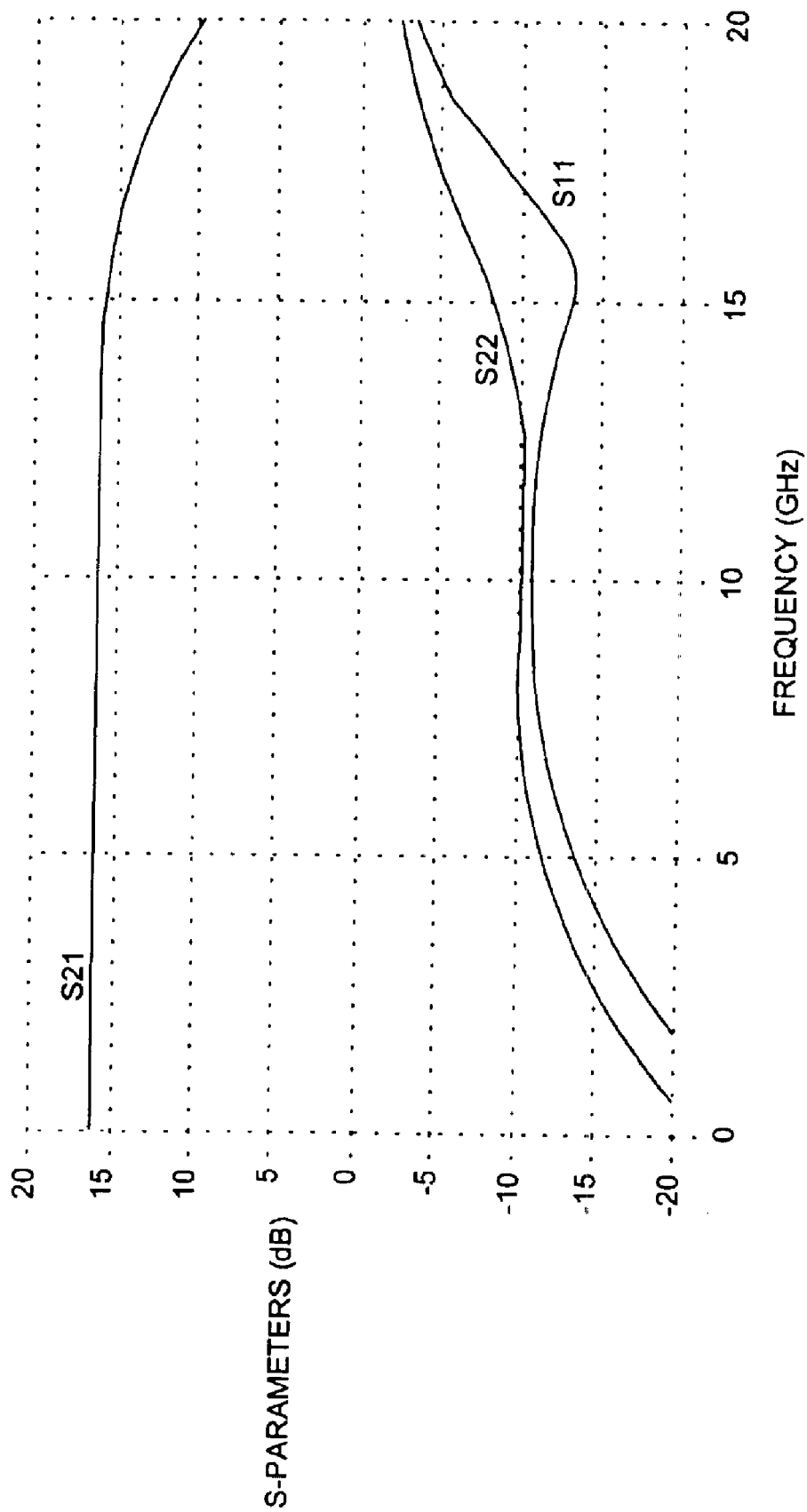
FIG. 13 illustrates a small signal response of the circuit of FIG. 11.

Referring to FIG. 13, a diagram illustrating a small signal response of the circuit 100 of FIG. 5 is shown. FIG. 13 illustrates that the circuit 100 may provide a gain of 15 dB with a 3-dB bandwidth of 18 Ghz. The circuit 100 may provide more than twice the bandwidth achieved by the conventional Darlington pair illustrated in FIG. 4. Such a signal gain-bandwidth is generally sufficient for SONET 12.5 Gb/s OC-192 applications.

Figure 14:
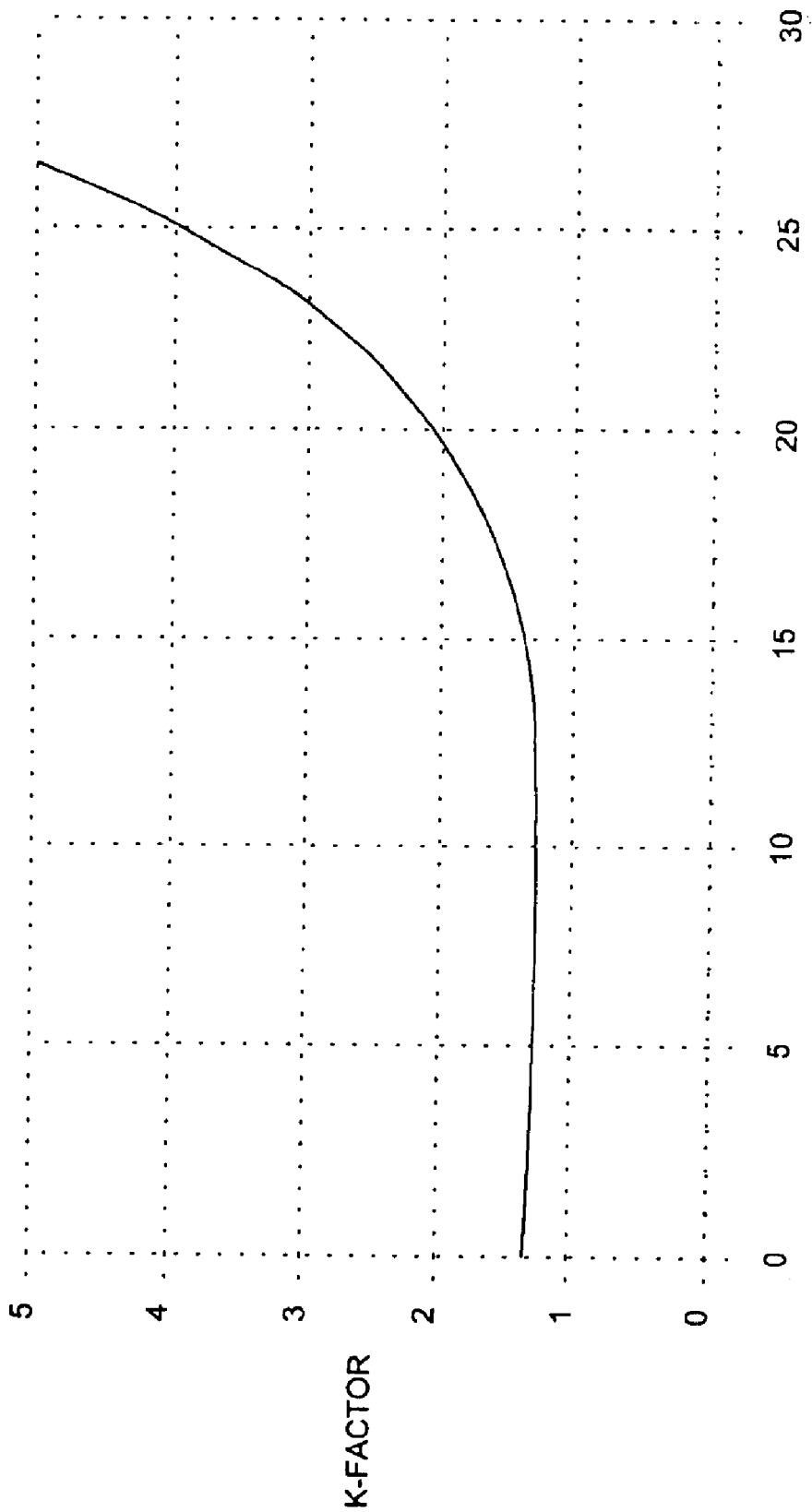
FIG. 14 illustrates a stability factor of the circuit of FIG. 11.

Referring to FIG. 14, a diagram illustrating a stability factor curve of the circuit 400 of FIG. 11 is shown. The stability factor of the cascode Darlington circuit 400 remains above 1 over the entire frequency band of interest indicating that the amplifier is generally unconditionally stable. This response suggests the desirability as well as feasibility of implementing the cascode Darlington circuit of the present invention for enhancing gain-bandwidth performance without compromising stability such as is the case of conventional gain peaking techniques.

Figure 15:
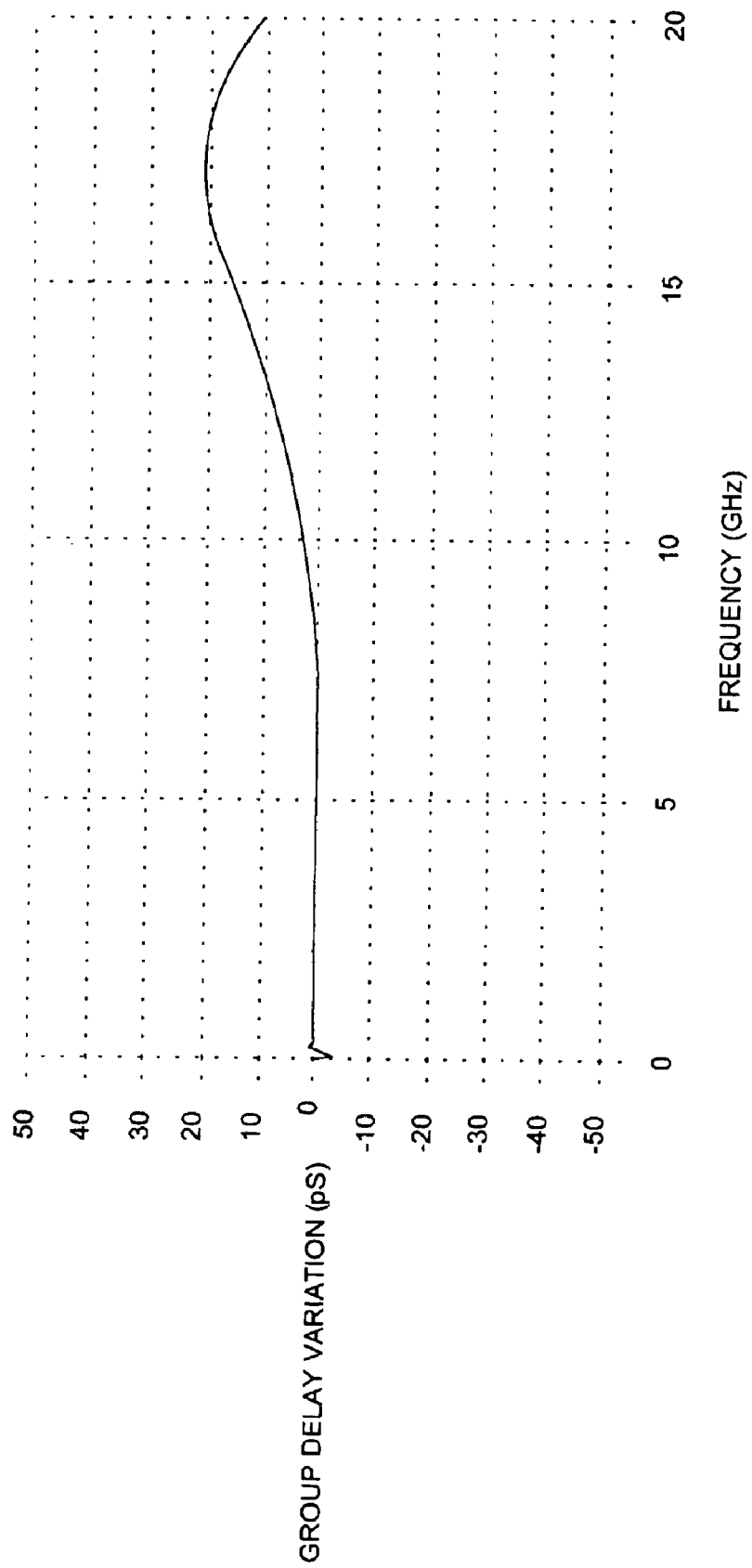
FIG. 15 illustrates a group delay performance of the circuit of FIG. 11.

Referring to FIG. 15, a diagram illustrating a group delay performance of the circuit 400 of FIG. 11 is shown. In wideband amplifier applications, and more specifically, optical modulator driver applications, flat group delay through the low amplifier is desirable. The circuit 400 generally achieves excellent group delay ripple of less than 5 pS up to 10 GHz, and less than 20 pS up through 20 Ghz. Such an excellent group delay characteristic suggests that the increase in gain-bandwidth product of the present invention may be obtained without compromising the group delay response typically generated by conventional gain peaking and positive feedback techniques.

Figure 16:
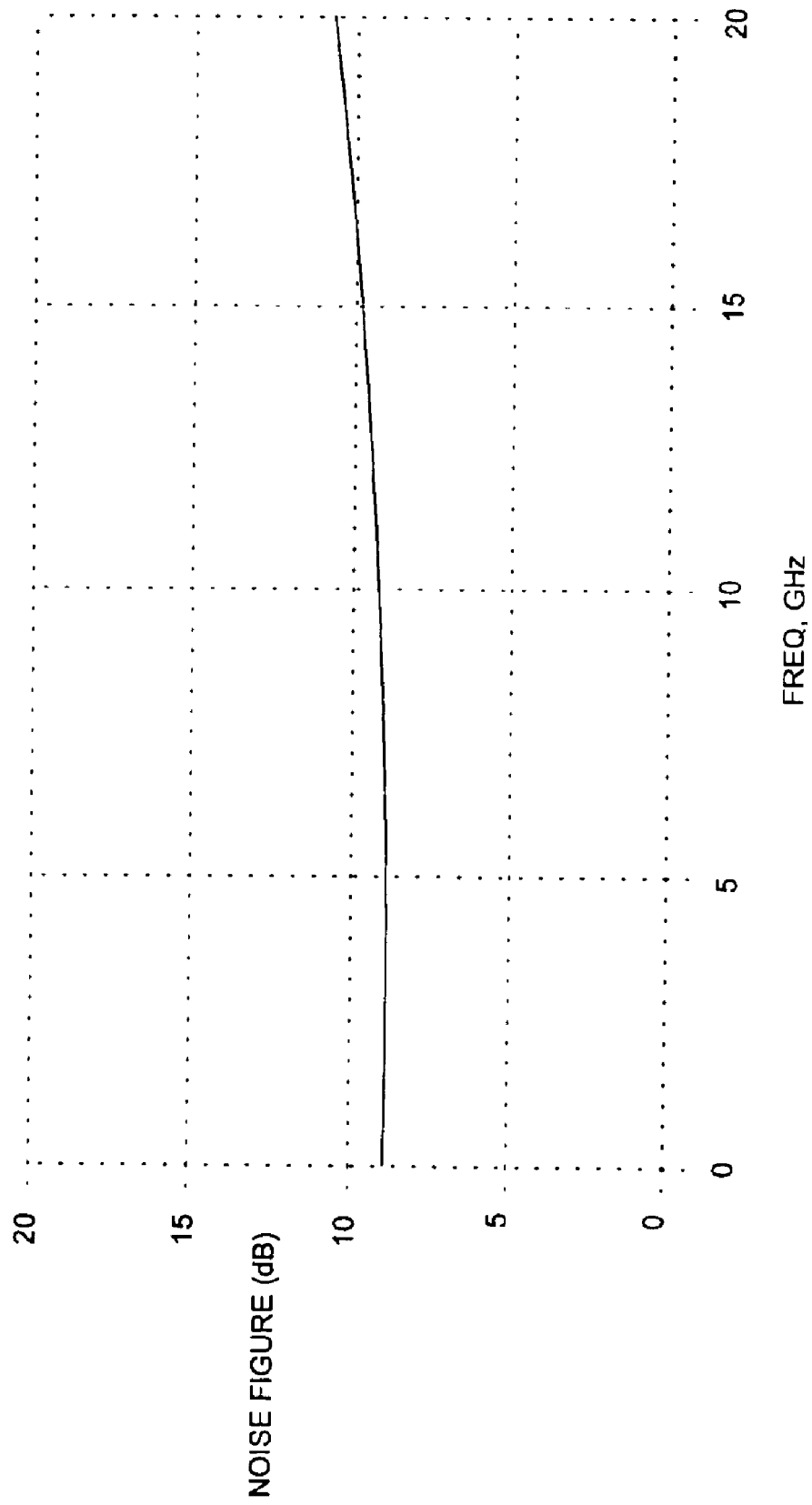
FIG. 16 illustrates a noise figure performance of the circuit of FIG. 11.

Referring to FIG. 16, a diagram illustrating a noise figure performance of the circuit 400 shown in FIG. 11 is shown. The noise figure of the amplifier is less than 10 dB across most of the band illustrating practical noise characteristics in an output driver application. The noise figure is generally only slightly higher (e.g., 2 dB) than the conventional Darlington circuit 10 which has two less transistors to contribute noise.

Referring to FIG. 17, a diagram illustrating a pseudorandom transient response waveform of the wideband driver amplifier application of the present invention as shown in FIG. 11 is illustrated. The output voltage transient response to a pseudo-random bit stream operating at 12.5 Gb/s is shown. The driver amplifier of the present invention illustrates +/−6 Volts peak to peak while still operating cleanly at a data rate of 12.5 Giga-bits per second. The simulations of FIGS. 12–17 illustrate that the present invention may be effectively implemented for wide band optical modulator driver applications.

The new high voltage, wide band amplifier topology of the present invention may provide higher gain-bandwidth, higher output power, and better thermal stability for many applications when compared to conventional approaches. Typical applications of the cascode Darlington amplifier of the present invention include but are not limited to (i) Mach-Zehnder optical modulator applications, (ii) Electro-absorption modulators (optical), (iii) High voltage wide CATV line drivers, (iv) Multi-band, tri-mode commercial wireless transmitters, (v) Wideband EW 2–18 GHz electronic warfare devices, (vi) Wideband test equipment, and/or (vii) Active doubler applications for test equipment. The cascode Darlington circuits 100, 200 and/or 300 of the present invention illustrate an improvement of more than double in gain-BW product over the conventional Darlington implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a transistor pair (i) comprising a first transistor and a second transistor and (ii) configured to generate an output signal in response to an input signal;
    a first common-base transistor coupled between said first transistor of said transistor pair and said output signal; and
    a second common-base transistor coupled between said second transistor of said transistor pair and said output signal, wherein (i) said first and second common-base transistors each have a base configured to receive a reference voltage and (ii) said first transistor and said second transistor of said transistor pair are separately connected to said output signal through said first common-base transistor and said second common-base transistor, respectively.

2. The apparatus according to claim 1, wherein said reference voltage is generated by a reference voltage generation circuit.

3. The apparatus according to claim 1, wherein (i) said first common-base transistor has a base that receives a first reference voltage generated by a first reference voltage generation circuit and (ii) said second common-base transistor has a base that receives a second reference voltage generated by a second voltage generation circuit.

4. The apparatus according to claim 1, wherein (i) said first and second common-base transistors are configured having said base of said first common-base transistor that receives said reference voltage.

5. The apparatus according to claim 1, wherein said first and second common-base transistors are configured to improve overall breakdown voltage, thermal stability, and bandwidth of said apparatus.

6. The apparatus according to claim 1, wherein said first and second common-base transistors are configured to break a feedback loop from said output signal to said bases of said transistor pair.

7. The apparatus according to claim 2, wherein said voltage generation circuit comprises a low impedance circuit.

8. The apparatus according to claim 1, wherein said apparatus is configured to reduce thermal electric feedback of said first and second common-base transistors.

9. The apparatus according to claim 3, wherein said first and second voltage generation circuits present different impedances to said bases of said first and second common-base transistors.

10. The apparatus according to claim 3, wherein bias signals presented by said first and second voltage generation circuits are adjusted to optimize intermodulation distortion response of said apparatus.

11. The apparatus according to claim 3, wherein impedances presented by said first and second voltage generation circuits are adjusted to optimize intermodulation distortion response of said apparatus.

12. The apparatus according to claim 1, wherein said first and second common-base transistors improve dynamic range of said apparatus.

13. The apparatus according to claim 1, wherein said first and second common-base transistors improve swing of said output signal.

14. An apparatus comprising:
    means for generating an output signal in response to an input signal, comprising a transistor pair having a first transistor and a second transistor;
    means for coupling a first common-base transistor between said first transistor of said transistor pair and said output signal; and
    means for coupling a second common-base transistor between said second transistor of said transistor pair and said output signal, wherein (i) said first and second common-base transistors each have a base configured to receive a reference voltage and (ii) said first transistor and said second transistor of said transistor pair are separately connected to said output signal through said first common-base transistor and said second common-base transistor, respectively.

15. A method for generating a wide dynamic range output signal comprising the steps of:
    (A) generating said output signal in response to an input signal, wherein said output signal is generated using a transistor pair comprising a first transistor and a second transistor;
    (B) coupling a first common-base transistor between said first transistor of said transistor pair and said output signal; and
    (C) coupling a second common-base transistor between said second transistor of said transistor pair and said output signal, wherein (i) said first and second common-base transistors each have a base configured to receive a reference voltage and (ii) said first transistor and said second transistor of said transistor pair are separately connected to said output signal through said first common-base transistor and said second common-base transistor respectively.

16. The method according to claim 15, wherein step (C) further comprises generating said reference voltage signal via a band-gap reference voltage generation circuit.

17. The method according to claim 15, said method further comprising the steps of:
    presenting a first reference voltage generated by a first reference voltage generation circuit to said first common-base transistor; and presenting a second reference voltage generated by a second voltage generation circuit to said second common-base transistor.

18. The method according to claim 17, said method further comprising adjusting impedances presented by said first and second voltage generation circuits to optimize said dynamic range of said output signal.

19. An apparatus comprising:
   a transistor pair configured to generate an output signal in response to an input signal;
   a first common-base transistor coupled between said Darlington transistor pair and said output signal; and
   a second common-base transistor coupled between said transistor pair and said output signal, wherein said first and second common-base transistors each have a base configured to receive a reference voltage generated by a band gap reference generation circuit.

20. The apparatus according to claim 1, wherein an emitter of said first transistor of said transistor pair is coupled to the base of said second transistor of said transistor pair.

21. The apparatus according to claim 20, wherein (i) an emitter of said first transistor of said transistor pair is coupled to ground through a first resistor and (ii) an emitter of said second transistor of said transistor pair is coupled to ground through a second transistor.

22. The apparatus according to claim 1, wherein (i) said transistor pair comprises a Darlington pair and (ii) said first and second common base transistor are integrated within said Darlington pair.

23. An apparatus comprising:
   a transistor pair (i) comprising a first transistor and a second transistor and (ii) configured to generate an output signal in response to an input signal;
   a first common-base transistor coupled between said first transistor of said transistor pair and said output signal; and
   a second common-base transistor coupled between said second transistor of said transistor pair and said output signal, wherein said first and second common-base transistors each have a base configured to receive a reference voltage, wherein (i) said first common-base transistor has a base that receives a first reference voltage generated by a first reference voltage generation circuit, (ii) said second common-base transistor has a base that receives a second reference voltage generated by a second voltage generation circuit, and (iii) said first and second voltage generation circuits present substantially equal impedance to said bases of said first and second common-base transistors.

* * * * *